(12) United States Patent
Garner et al.

(10) Patent No.: US 7,077,174 B2
(45) Date of Patent: Jul. 18, 2006

(54) METHOD OF POTTING A COMPONENT

(75) Inventors: Paul Anthony James Garner, Chelmsford (GB); Ian Anthony Moore, Chelmsford (GB)

(73) Assignee: BAE Systems PLC, Farnborough (GB)

( * ) Notice: Subject to any disclaimer, the term of this patent is extended or adjusted under 35 U.S.C. 154(b) by 85 days.

(21) Appl. No.: 10/490,623

(22) PCT Filed: Sep. 12, 2002

(86) PCT No.: PCT/GB02/04142

§ 371 (c)(1),
(2), (4) Date: Mar. 25, 2004

(87) PCT Pub. No.: WO03/026870

PCT Pub. Date: Apr. 3, 2003

(65) Prior Publication Data
US 2004/0194843 A1    Oct. 7, 2004

(30) Foreign Application Priority Data
Sep. 26, 2001 (GB) ................................. 0123234.7

(51) Int. Cl.
*B65B 1/04* (2006.01)
(52) U.S. Cl. ........................... 141/67; 141/66; 264/102; 264/500
(58) Field of Classification Search ............ 141/65–67, 141/98; 264/102, 500, 548, 272.11, 272.13, 264/331.12, 331.16
See application file for complete search history.

(56) References Cited

U.S. PATENT DOCUMENTS

| 4,228,832 A | 10/1980 | Brown |
| 4,681,718 A | 7/1987 | Oldham |
| 5,057,348 A | 10/1991 | Drain et al. |
| 5,670,203 A | 9/1997 | Terhardt et al. |

FOREIGN PATENT DOCUMENTS

| FR | 2 702 990 | 9/1994 |
| JP | 61 172711 | 4/1986 |
| JP | 4-265283 A | 2/1991 |
| JP | 03 28120 | 11/1991 |
| JP | 3-281210 A | 12/1991 |
| JP | 5-259652 A | 10/1993 |
| JP | 8-010582 A | 7/1994 |
| JP | 8-064627 A | 3/1996 |
| JP | 2000-317975 A | 11/2000 |
| JP | 2001-044228 A | 2/2001 |

*Primary Examiner*—Steven O. Douglas
(74) *Attorney, Agent, or Firm*—Crowell & Moring LLP

(57) ABSTRACT

This invention relates to a method of potting a component, namely encasing a component (110) in a potting compound (112) with, optionally, all or some of the voids in the component also being filled with potting compound. In particular, the present invention relates to potting a component that will be subject to high electric field strengths in use. The method comprises introducing an inert gas into a first pressure vessel (100) containing the component to be potted thereby to create an inert environment, introducing a potting compound into the first pressure vessel and allowing the potting compound to cure in the inert environment.

22 Claims, 2 Drawing Sheets

METHOD OF POTTING A COMPONENT

This invention relates to a method of encasing a component in a potting compound with, optionally, all or some of the voids in the component also being filled with potting compound.

BACKGROUND OF THE INVENTION

Typically, a fluid such as a silicone elastomer or a polyester is introduced to the component to be potted such that the component is enveloped in the potting compound. The potting compound is then allowed to cure to form a solid around and, possibly, within the component. Excess potting material can then be removed as required.

In particular, the present invention relates to potting a component that will be subject to high electric field strengths in use. For example, electrical or electronic devices or parts thereof are often potted in a dielectric material, i.e. the potting compound then forms a dielectric between conducting components. This is advantageous because the potting compound usually offers greater resistance to electrical breakdown when exposed to high electrical fields than merely leaving an air-gap between conducting components. In addition, the potting compound may offer some structural support.

However, known potting compounds have only limited capability as dielectrics because their electrical breakdown value is too low for use at high voltages. Although polymers used as potting compounds have typical intrinsic electrical breakdown values of 10–100 kV/mm, this value is not reflected in the potting compound when cured due to the presence of air-filled voids. The onset of breakdown in these voids is quicker due to the far lower electrical breakdown value of air and, worse still, it is thought that formation of breakdown streamers in the voids initiates breakdown in the potting compound itself. Hence, the insulating capability of known potting compounds is greatly diminished.

SUMMARY OF THE INVENTION

According to a first aspect, the present invention resides in a method of potting a component comprising the steps of: (a) introducing an inert gas into a first pressure vessel containing the component to be potted thereby to create an inert environment; (b) introducing a potting compound into the first pressure vessel; and (c) allowing the potting compound to cure in the inert environment.

This is desirable because performing the potting process in an inert environment means that any voids forming within the potting compound will be filled with the inert gas. Inert gases offer the highest electrical breakdown values by their very nature.

Optionally, the inert gas may be introduced into the first pressure vessel prior to introducing the potting compound.

Conveniently, the method may comprise the step of introducing the inert gas into the first pressure to a pressure of at least 1 MPa (10 bar) although a pressure or substantially 0.2 to 0.3 MPa (2 to 3 bar) is preferred.

Advantageously, the method may comprise the step of maintaining an inert environment for substantially all of the curing time of the potting compound. This ensures that no gases with inferior electrical breakdown values can be adsorbed into the potting compound while it is curing.

Optionally, the method may further comprise the steps of reducing the pressure in the first pressure vessel after introducing the inert gas thereby to create an inert vacuum and maintaining an inert vacuum during introduction of the potting compound. The voids that form in the potting compound during the potting process are filled with the gas that occupies the pressure vessel. Accordingly, it is advantageous to purge the pressure vessel to create an inert environment, then to evacuate the inert gas before finally introducing the potting compound and allowing it to set at elevated pressure. This is because it reduces the number of voids that may form in the potting compound during curing, and any voids that do form will be filled with inert gas at high pressure.

Advantageously, the method may further comprise the step of reducing the pressure in the first pressure vessel thereby to create a vacuum prior to introducing the inert gas. This enhances the purging process with the inert gas as at least some of the air in the pressure vessel is evacuated prior to filling with the inert gas.

Either or both of the steps of reducing the pressure in the first pressure vessel may, optionally, produce a vacuum of at least 100 Pa (approximately 0.75 Torr), although a vacuum of at least 10 Pa (approximately $7.5 \times 10^{-2}$ Torr) is currently preferred. Moreover, it is further preferred to reduce the pressure in the first pressure vessel to produce a vacuum of at least 1 Pa (approximately $7.5 \times 10^{-3}$ Torr), a vacuum of substantially 0.13 Pa (approximately $1 \times 10^{-3}$ Torr) being preferred yet further.

Preferably, the method may further comprise the step of introducing the potting compound into the first pressure vessel from a second pressure vessel. Introducing the potting compound into the first pressure vessel from the second pressure vessel by introducing an inert gas into the second pressure vessel is a convenient way of achieving this. In addition, use of the inert gas makes available only further inert gas for incorporation within the potting compound as voids.

Optionally, the method may further comprise the step of reducing the pressure in the second pressure vessel thereby to produce a vacuum prior to introducing the potting compound into the first pressure vessel. Firstly, this reduces the gases available to be taken up by the potting compound as voids and also removes gases already taken up by the potting compound, particularly if the reduced pressure is maintained for a substantial time.

Preferably, the method may further comprise the step of introducing an inert gas into the second pressure vessel thereby to create an inert environment prior to reducing the pressure in the second pressure vessel. This ensures that a minimum number of inert gas-filled voids will be present in the potting compound before it is introduced into the first pressure vessel. It is particularly important where the first pressure vessel has been purged with inert gas because its effectiveness will be undermined by introducing air with the potting compound. Hence, the optional use of a nitrogen-actuated hydraulic piston is beneficial in that it also safeguards against the introduction of air. Advantageously, the method comprises the step of introducing an inert gas into the second pressure vessel to a pressure of at least 0.1 MPa (1 bar).

Optionally, the method may further comprise the step of reducing the pressure in the second pressure vessel thereby to produce a vacuum prior to introducing the inert gas. This is essentially a purging procedure, with the initial pressure reduction removing air both from the pressure vessel and from the potting compound before reintroducing the inert gas to dilute any air that may be present. Conveniently, the method may further comprise the step of maintaining the vacuum for at least 5 minutes. It is currently preferred to maintain the vacuum for at least 10 minutes, maintaining the vacuum for substantially 20 minutes being preferred still further. As will be appreciated, more gas will be removed from the potting compound the longer the second pressure vessel is maintained at a reduced pressure. However, the gas yield from the potting compound will be ever diminishing as the reduced pressure is maintained.

Preferably, either or both of the steps of reducing the pressure in the second vessel produces a vacuum of at least 101 kPa (approximately 30 inHg) and may, optionally, produce a vacuum of substantially 95 to 101 kPa (approximately 28 to 30 inHg).

Optionally, any or all of the inert gases used are nitrogen, oxygen-free nitrogen or sulphur hexafluoride. It should be clear from this context that the term nitrogen is intended to cover both 100% pure nitrogen and also gaseous mixtures comprised substantially of nitrogen but containing residual traces of other gases. In practice, all industrially obtained nitrogen will contain some traces of other gases. "Oxygen-free nitrogen" is commonly available to purchase, and corresponds to a gaseous mixture where extra precautions are taken to minimise the residual fraction of oxygen in the mixture.

Preferably, the method further comprises the step of elevating the pressure within the first pressure vessel to above atmospheric pressure and maintaining an elevated pressure for at least part of the curing time of the potting compound. In this way, any voids that form within the potting compound during the potting process tend to reduce in size thereby increasing the pressure of any gas trapped within the cavities. As will be readily understood, the smaller the volume occupied by the voids, the larger the volume occupied by the potting compound with its superior electrical breakdown strength. Moreover, the electrical breakdown value is also directly proportional to pressure: the greater the pressure in the voids, the higher the electrical fields that can be tolerated before breakdown. The increased electrical breakdown values of inert gases coupled with the further increase obtained by increasing the pressure of the inert gases within the voids can produce electrical breakdown values of the voids that exceed that of the potting compound material itself. This, of course, provides a more than adequate solution to the problem of electrical breakdown within known potting compounds when used as dielectrics.

Maintaining the elevated pressure may be passive or active. For example, it may be passive in merely raising the pressure within the first pressure vessel before sealing the first pressure vessel. Even if the seals are not perfect, it will take a finite time for the pressure within the pressure vessel to fall back to atmospheric pressure and, so, this is also intended to be within the scope of 'maintaining an elevated pressure'.

Conveniently, the method may comprise the step of maintaining the elevated pressure for substantially all of the curing time of the potting compound. This ensures that any voids are kept small and any gasses trapped therein are kept at high pressure until the potting compound is fully cured and so the potting compound cannot relax to allow the cavities to increase in size and the pressures within the cavities to decrease.

Optionally, the method may comprise the step of reducing the internal volume of the first pressure vessel thereby to elevate the pressure within the first pressure vessel. This is most easily achieved using a piston moveable within the pressure vessel. Accordingly, the method may comprise the step of moving a piston into the first pressure vessel thereby to reduce its internal volume. Conveniently, the method may comprise the step of actuating movement of a hydraulic piston using an inert gas. Where an elevated pressure is to be maintained for substantially all of the curing time of the potting compound, the piston may be withdrawn only when the potting compound has cured. This ensures that the pressure within the first pressure vessel is maintained throughout the curing time of the potting compound.

According to one embodiment of the present invention, the method may comprise the step of elevating the pressure to at least 1 MPa (10 bar). Advantageously, the method may comprise the step of elevating the pressure to at least 2 MPa (20 bar) or, optionally, elevating the pressure to substantially 3 MPa (30 bar).

BRIEF DESCRIPTION OF THE DRAWINGS

In order that the invention can be more readily understood, reference will now be made, by way of example only, to the accompanying drawings in which.

DETAILED DESCRIPTION OF THE INVENTION

Figure 1:
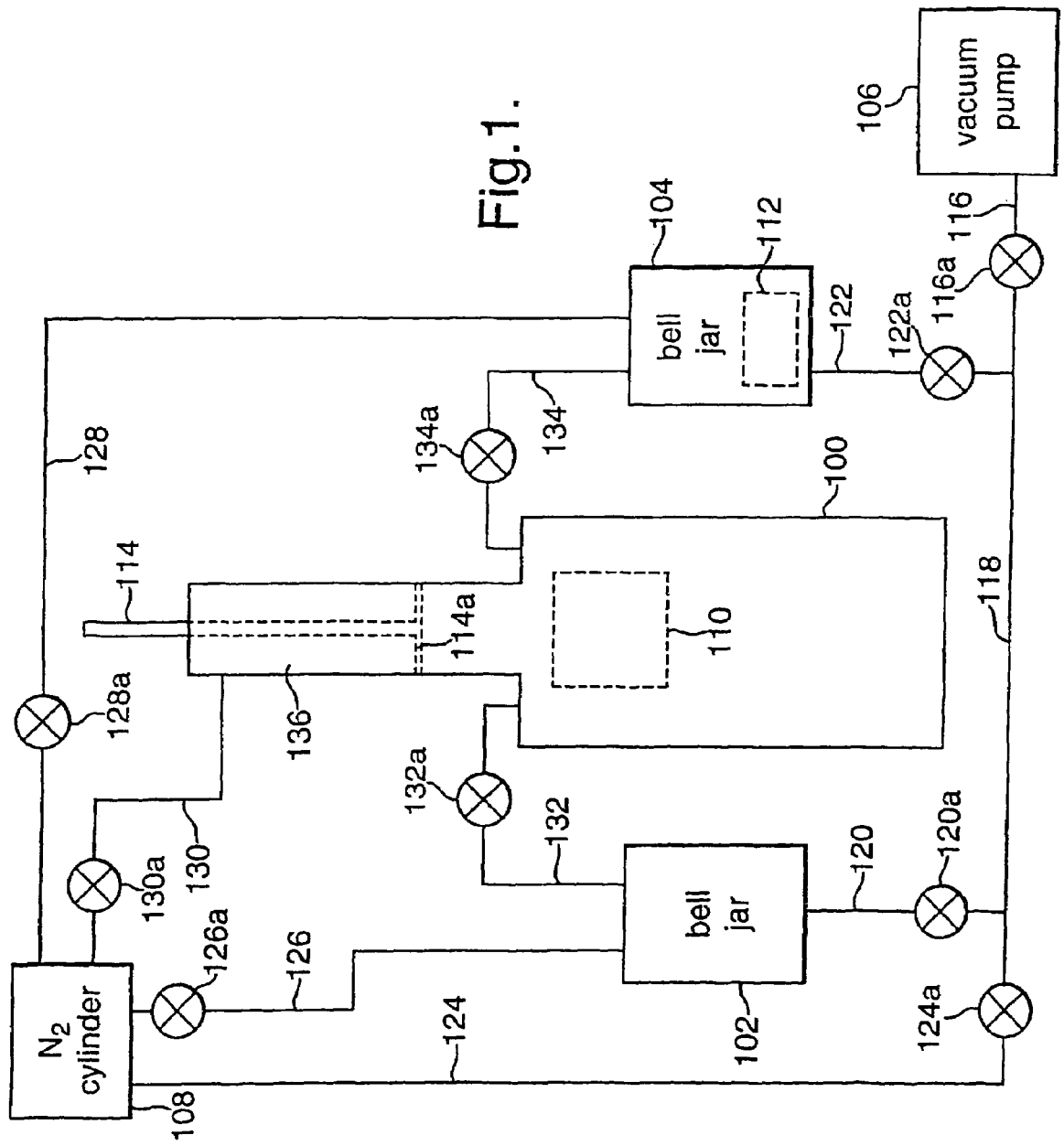
FIG. 1 is a schematic representation of apparatus suitable for use with the method of the present invention.

As can be seen from FIG. 1, the apparatus shown comprises a pressure vessel 100, a pair of bell jars 102 and 104, a vacuum pump 106 and a nitrogen cylinder 108, all connected through various lines and valves. The component 110 to be potted resides in the pressure vessel 100. The component in this example is an electronic device, although the invention may be used with many other types of components. Initially, the potting compound 112 (10:1 by weight of the component 110) resides in a second pressure vessel, namely the bell jar 104. In this embodiment, the potting compound 112 used was a silicone elastomer, but other potting compounds such as polyesters may be suitable.

The pressure vessel 100 is provided with a piston 114 operable to change the internal volume of the pressure vessel 100: initially, the piston 114 is positioned in a retracted position to allow a gap of 30 mm in the base of the piston 114 (not illustrated). To ensure the piston 114 remains in the retracted position, spacers (not shown) are fitted around the piston 114 to act as a physical stop.

The vacuum pump 106 communicates to the rest of the apparatus through a common line 116 that contains an isolation valve 116a operable to isolate the vacuum pump 106 from the rest of the apparatus. In normal use, the isolation valve 116a is left open at all times to maintain a vacuum in line 118, whereas the other valves are normally left closed and only opened when necessary. Bell jar 102 is in communication with the vacuum pump 106 via lines 118, 120 and the common line 116. A valve 120a opens the bell jar 102 to the vacuum pump 106 and effectively links lines 118 and 120. Bell jar 104 communicates with the vacuum pump 106 in similar fashion, namely via common line 116 and lines 118 and 122. Valve 122a joins lines 118 and 122 and is operable to open the bell jar 104 to the vacuum pump 106. A direct link is also provided between the vacuum pump 106 and the nitrogen cylinder 108 via lines 118 and 124 and common line 116. The nitrogen cylinder 108 can be opened to the vacuum pump via valve 124a that links lines 118 and 124.

It should be understood that FIG. 1 is purely schematic. Positions of valves on lines and the routing of the lines are arranged to optimise clarity and so positional relationships should not be taken as absolutes from FIG. 1.

The nitrogen cylinder 108 contains oxygen-free nitrogen, although the term 'nitrogen' cylinder is used for the sake of brevity. The nitrogen cylinder supplies oxygen-free nitrogen to the bell jars 102 and 104 and to the piston 114 through lines 126, 128 and 130 respectively. The bell jars 102 and 104 and the piston 114 can be opened to the nitrogen cylinder 108 using valves 126a, 128a and 130a respectively.

Both bell jars 102 and 104 are in communication with the pressure vessel 100 through lines 132 and 134 respectively that contain valves 132a and 134a respectively.

All lines and valves, the bell jars 102 and 104, the vacuum pump 106 and the nitrogen cylinder 108 mentioned above are all common components used frequently in the art and may be assembled according to the above arrangement in any number of ways commonly known in the art.

Figure 2:
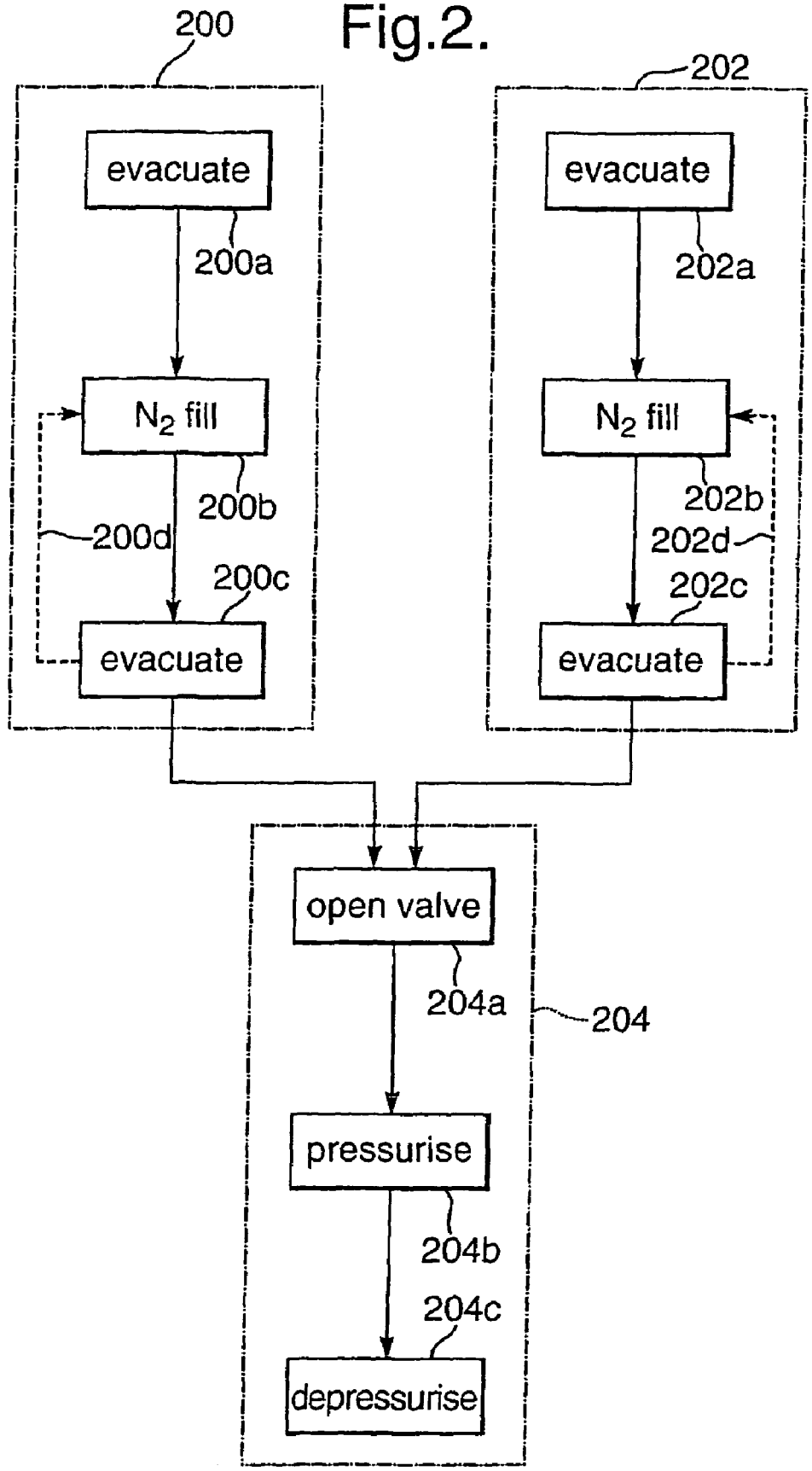
FIG. 2 is a flow diagram representative of an embodiment of the present invention.

Turning to FIG. 2, an embodiment of the method of the present invention is shown. As can be seen, the method is essentially a three stage process indicated at 200, 202 and 204. Stages 200 and 202 are carried out in tandem before the final stage 204 is performed. Stage 200 corresponds to purging the pressure vessel 100 and stage 202 corresponds to purging the potting compound bell jar 104. Stage 204 corresponds to the potting process itself.

Purging the pressure vessel at 200 begins with evacuation of the pressure vessel at 200a to a pressure of $1\times10^{-3}$ Torr (0.13 Pa). This is performed using the vacuum pump 106 opened to the pressure vessel 100 via bell jar 102 and lines 116, 118, 120 and 132. Of course, valves 120a and 132a must be opened. The evacuation removes air from pressure vessel 100 and bell jar 102 to leave a vacuum.

Once the evacuation 200a is complete, valve 120a is closed to isolate the bell jar 102 and pressure vessel 100 from the vacuum pump 106. Valve 132a is left open for the time being, thereby leaving the pressure vessel 100 in communication with the bell jar 102. The nitrogen fill 200b is then started. The nitrogen fill 200b comprises filling the pressure vessel 100 with oxygen-free nitrogen from the nitrogen cylinder 108 to a pressure of 2 to 3 bar (0.2 to 0.3 MPa): the pressure is controlled using a regulator on the nitrogen cylinder 108 (not shown). Nitrogen is introduced into the pressure vessel 100 through bell jar 102 and lines 126 and 132 by opening valve 126a (valve 132a being left open after the evacuation 200a). Accordingly, the pressure vessel 100 and bell jar 102 are now filled with inert oxygen-free nitrogen, with only a very low partial pressure of air remaining. When the nitrogen fill 200b is complete, valve 126a is closed to isolate the bell jar 102 and the pressure vessel 100 from the nitrogen cylinder 108.

The third stage of purging the pressure vessel 100 is to evacuate the pressure vessel 100 and the bell jar 102 at 200c to a pressure of $1\times10^{-3}$ Torr (0.13 Pa). This is performed by opening valve 120a so that the bell jar 102 and pressure vessel 100 are once more open to the vacuum pump 106 via lines 116, 118 and 120. This second evacuation stage 200c ensures that the pressure vessel 100 contains only residual amounts of oxygen-free nitrogen, the trace amounts of other gases present being negligible. When the evacuation 200c is complete, valve 120a is closed to isolate the vacuum pump 106 from the bell jar 102 and the pressure vessel 100.

In order to maximise the ratio of oxygen-free nitrogen to the trace amounts of other gases in the vacuum left at the end of purging the pressure vessel 100, the nitrogen fill stage 200b and evacuation stage 200c are repeated as appropriate, as indicated generally at 200d. The repeated purging steps 200b and 200c see an ever-diminishing return in terms of increasing the oxygen-free nitrogen fraction of the vacuum, and four or five purging cycles are considered appropriate. Once purging 200 is finally complete, valve 132a is also closed to isolate the pressure vessel 100 from the bell jar 102.

In tandem with purging the pressure vessel at 200, purging the potting compound bell jar 104 is performed at 202. Strictly speaking, the two purges 200 and 202 need not be performed concurrently and can instead be performed consecutively, in either order. However, tandem operation is performed for the sake of efficiency and to ensure that the vacuums in the pressure vessel 100 and the bell jar 104 are in their optimum states at the start of the third and final stage 204.

Purging the bell jar 104 at 202 starts with its evacuation at 202a. This is performed by opening the bell jar 104 to the vacuum pump 106 via lines 116, 118 and 122 by opening valve 122a. The pressure in the bell jar 104 is reduced to 28 to 30 inHg (94.8 to 101.6 kPa) and is maintained at this level for twenty minutes. This continued pumping evacuates air initially contained within the bell jar 104 and air leaking from the potting compound 112. This ensures that the potting compound 112 is substantially free of voids. Due to the lengthy pumping time, purging at 202 is often started in advance of purging at 200.

Once the evacuation 202a is compete, valve 122a is closed to isolate the vacuum pump 106 from the bell jar 104. The bell jar 104 is then filled with oxygen-free nitrogen at 202b to a pressure of one atmosphere. The oxygen-free nitrogen is supplied by the nitrogen cylinder 108 via line 128 by opening valve 128a. Filling the bell jar 104 with oxygen-free nitrogen ensures an inert environment and that any voids within the potting compound 112 are filled with inert oxygen-free nitrogen. Once the nitrogen fill 202b is complete, valve 128a is closed to isolate the bell jar 104 from the nitrogen cylinder 108.

The bell jar 104 is evacuated once more to a pressure of 28 to 30 inHg (94.8 to 101.6 kPa) at 202c. This is achieved by opening bell jar 104 to vacuum pump 106 via lines 116, 118 and 122 by opening valve 122a. When pumping is complete, the bell jar 104 is isolated from the vacuum pump 106 by closing the valve 122a. This ensures that the bell jar contains only a trace amount of oxygen-free nitrogen with negligible trace amounts of other gases. Similarly, a minimal number of voids within the potting compound 112 results, and these are filled with inert oxygen-free nitrogen.

In order to maximise the ratio of oxygen-free nitrogen to the trace amounts of other gases in the vacuum left at the end of purging the bell jar 202, the nitrogen fill stage 202b and evacuation stage 202c are repeated as appropriate, as indicated generally at 202d. The repeated purging steps 202b and 202c see an ever-diminishing return in terms of increasing the oxygen-free nitrogen fraction of the vacuum, and four or five purging cycles are considered appropriate.

When the purging stages 200 and 202 are completed, the potting stage 204 can be started. Firstly, valve 134a on line 134 that joins the pressure vessel 100 and the bell jar 104 is opened at 204a. As the bell jar 104 is at a higher pressure than the pressure vessel 100, some of the residual oxygen-free nitrogen is drawn into the pressure vessel 100 which, in turn, draws the potting compound 112 through with it. To ensure that substantially all the potting compound 112 is drawn through into the pressure vessel 100, the bell jar 104 is slightly pressurised with oxygen-free nitrogen. The oxygen-free nitrogen is provided by the nitrogen cylinder 108 through line 128 by opening valve 128a. As the potting compound 112 enters the pressure vessel 100, it encapsulates the component 110, filling any voids within the component 110.

As soon as the pressure vessel 100 is full of potting compound 112, the pressure vessel 100 is isolated from the rest of the apparatus by closing valve 134a. The pressure vessel 100 is then pressurised to 30 bar (3 MPa) by extending the hydraulic piston 114 into the pressure vessel 100 as indicated at 204b. To do this, the spacers (not shown) must first be removed. The hydraulic piston 114 is actuated by oxygen-free nitrogen supplied from the nitrogen-cylinder 108 through line 130 by opening valve 130a. As is clear from FIG. 1, the oxygen-free nitrogen is introduced into the air-tight cavity 136 behind the piston's face 114a thereby driving the piston 114 into the pressure vessel 100. To retract the piston 114, oxygen-free nitrogen is vented from the over-pressurised cavity 136 through a pressure relief valve (not shown) provided on line 130 between valve 130 and the pressure vessel 100. As the piston face 114a effectively seals the inside of the pressure vessel 100 from the cavity 136, there should be no leakage of gases between the two. However, even if gas does happen to leak from the cavity into the pressure vessel 100, the use of oxygen-free nitrogen to drive the hydraulic piston 114 ensures that an inert environment is maintained in the pressure vessel 100.

The piston 114 is held in place whilst the potting compound 112 cures so that the elevated pressure of 30 bar is maintained (allowing for some possible leakage if the pressure vessel 100 is imperfectly sealed). When the potting compound 112 is set fully, the piston 114 can be withdrawn to relieve the pressure in the pressure vessel 100 as indicated at 204c. The potted component 110 can then be retrieved for further processing as required (e.g. trimming of excess potting compound 112).

Maintaining an elevated pressure in the pressure vessel 100 while the potting compound 112 cures ensures that any voids in the potting compound are small in size and contain oxygen-free nitrogen at a pressure of 30 bar (3 MPa). The resulting potted component 110 will thus have a dielectric comprised of the cured potting compound that has an intrinsic electrical breakdown value of around 10 kV/mm and that has only small voids filled with pressurised oxygen-free nitrogen with an electrical breakdown value of around 50 kV/mm. Accordingly, the component 110 may be exposed to higher electrical fields than components potted according to prior known methods without breakdown in the voids initiating breakdown across the whole dielectric. As will be appreciated, this allows components to be made that have far greater fields of application.

Variations to the embodiment described above are possible without departing from the scope of the claims.

For example, whilst oxygen-free nitrogen has been described as a currently-preferred example of an inert gas, the person skilled in the art will be able to identify readily other suitable inert gases. In particular, sulphur hexafluoride ($SF_6$), helium, argon and neon are suitable alternatives that may be used.

Furthermore, whilst a pressure differential is used to transfer the potting compound from the bell jar 104 to the pressure vessel 100, other methods are possible. For example, a piston may be used to effect transfer, or a height differential could be used such that gravity affects the transfer.

It will be abundantly clear that the bell jar 102 may be omitted from the above embodiment, with the nitrogen cylinder 108 being directly connected to the pressure vessel through line 126 and valve 126a and with the vacuum pump 106 being directly connected to the pressure vessel 100 through line 120 and valve 120a. Providing a pair of bell jars 102 and 104 is beneficial in that it increases flexibility. For example, the functions of the bell jars 102 and 104 may be swapped, i.e. bell jar 102 may house the potting compound 112 and the pressure vessel 100 may be purged at 200 through bell jar 104.

The pressure vessel 100 could be pressurised at 204b by any number of ways. For example, further inert gas could be used to over-pressurise the pressure vessel 100, although this method is not favoured over the use of a piston as it will inevitably lead to a greater take up of inert gas into the potting compound 112 leading to more voids being formed.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A method of potting a component comprising the steps of:
   (a) introducing an inert gas into a first pressure vessel containing the component to be potted thereby to create an inert environment;
   (b) introducing a potting compound into the first pressure vessel; and
   (c) allowing the potting compound to cure in the inert environment; wherein,
   the inert gas is introduced into the first pressure vessel prior to introducing the potting compound;
   the method further comprises the steps of reducing the pressure in the first pressure vessel after introducing the inert gas thereby to create an inert vacuum, and maintaining an inert vacuum during introduction of the potting compound; and
   the step of reducing the pressure in the first pressure vessel produces a vacuum of at most 100 Pa.

2. A method according to claim 1, wherein either or both of the steps of reducing the pressure in the first pressure vessel produces a vacuum of at most 10 Pa.

3. A method according to claim 2, wherein either or both of the steps of reducing the pressure in the first pressure vessel produces a vacuum of at most 1 Pa.

4. A method according to claim 3, wherein either or both of the steps of reducing the pressure in the first pressure vessel produces a vacuum of substantially 0.13 Pa.

5. A method of potting a component comprising the steps of:
   (a) introducing an inert gas into a first pressure vessel containing the component to be potted thereby to create an inert environment;
   (b) introducing a potting compound into the first pressure vessel; and
   (c) allowing the potting compound to cure in the inert environment;
   the method further comprises the step of introducing the potting compound into the first pressure vessel from a second pressure vessel; and
   wherein the potting compound is introduced into the first pressure vessel from a second pressure vessel, by introducing an inert gas into the second pressure vessel.

6. A method of potting a component comprising the steps of:

(a) introducing an inert gas into a first pressure vessel containing the component to be potted thereby to create an inert environment;
(b) introducing a potting compound into the first pressure vessel; and
(c) allowing the potting compound to cure in the inert environment; wherein,
the method further comprises the step of introducing the potting compound into the first pressure vessel from a second pressure vessel; and
pressure in the second pressure vessel is reduced, thereby to produce a vacuum prior to introducing the potting compound into the first pressure vessel.

7. A method according to claim 6, further comprising the step of introducing an inert gas into the second pressure vessel thereby to create an inert environment prior to reducing the pressure in the second pressure vessel.

8. A method according to claim 7, comprising the step of introducing an inert gas into the second pressure vessel to a pressure of at least 0.1 MPa.

9. A method according to claim 7, further comprising the step of reducing the pressure in the second pressure vessel thereby to produce a vacuum prior to introducing the inert gas.

10. A method according to claim 9, further comprising the step of maintaining the vacuum for at least 5 minutes.

11. A method according to claim 10, further comprising the step of maintaining the vacuum for at least 10 minutes.

12. A method according to claim 11, further comprising the step of maintaining the vacuum for substantially 20 minutes.

13. A method according to claim 6, wherein either or both of the steps of reducing the pressure in the second pressure vessel produces a vacuum of at most 101 kPa.

14. A method according to claim 11, wherein either or both of the steps of reducing the pressure in the second pressure vessel produces a vacuum of substantially 95 to 101 kPa.

15. A method according to claim 14, wherein all of the inert gases used are nitrogen, oxygen-free nitrogen or sulphur hexafluoride.

16. A method of potting a component comprising the steps of:
(a) introducing an inert gas into a first pressure vessel containing the component to be potted thereby to create an inert environment;
(b) introducing a potting compound into the first pressure vessel; and
(c) allowing the potting compound to cure in the inert environment; wherein the method further comprises,
elevating the pressure within the first pressure vessel to above atmospheric pressure and maintaining an elevated pressure for substantially all of the curing time of the potting compound; and
reducing the internal volume of the first pressure vessel thereby to elevate the pressure within the first pressure vessel.

17. A method according to claim 16, comprising the step of moving a piston into the first pressure vessel thereby to reduce its internal volume.

18. A method according to claim 17, comprising the step of actuating movement of a hydraulic piston using an inert gas.

19. A method according to claim 17, comprising the step of releasing the piston when the potting compound has cured.

20. A method of potting a component comprising the steps of:
(a) introducing an inert gas into a first pressure vessel containing the component to be potted thereby to create an inert environment;
(b) introducing a potting compound into the first pressure vessel; and
(c) allowing the potting compound to cure in the inert environment; wherein the method further comprises,
elevating the pressure within the first pressure vessel to above atmospheric pressure and maintaining an elevated pressure for substantially all of the curing time of the potting compound; and
elevating the pressure to at least 1 MPa.

21. A method according to claim 20, comprising the step of elevating the pressure to at least 2 MPa.

22. A method according to claim 21, comprising the step of elevating the pressure to substantially 3 MPa.

* * * * *